(12) United States Patent
Perner

(10) Patent No.: US 7,042,757 B2
(45) Date of Patent: May 9, 2006

(54) 1R1D MRAM BLOCK ARCHITECTURE

(75) Inventor: Frederick A. Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 70 days.

(21) Appl. No.: 10/794,302

(22) Filed: Mar. 4, 2004

(65) Prior Publication Data

US 2005/0195647 A1   Sep. 8, 2005

(51) Int. Cl.
 *G11C 11/00* (2006.01)

(52) U.S. Cl. ............... 365/158; 365/148; 365/171

(58) Field of Classification Search ........... 365/158, 365/205, 207, 171, 148
See application file for complete search history.

(56) References Cited

U.S. PATENT DOCUMENTS

| | | |
|---|---|---|
| 6,188,615 B1 | 2/2001 | Perner et al. |
| 6,259,644 B1 | 7/2001 | Tran et al. |
| 6,262,625 B1 | 7/2001 | Perner et al. |
| 6,462,980 B1 | 10/2002 | Schuster-Woldan et al. |
| 6,512,688 B1 * | 1/2003 | Thewes et al. ............. 365/158 |
| 6,587,384 B1 | 7/2003 | Perner |
| 6,606,262 B1 | 8/2003 | Perner |
| 6,611,452 B1 | 8/2003 | Han |
| 6,614,682 B1 | 9/2003 | Hirai |
| 6,625,057 B1 * | 9/2003 | Iwata ......................... 365/158 |
| 6,816,403 B1 * | 11/2004 | Brennan et al. ............ 365/158 |
| 6,847,568 B1 * | 1/2005 | Gogl et al. ................. 365/205 |

* cited by examiner

*Primary Examiner*—Gene N. Auduong

(57) ABSTRACT

This invention provides a 1R1D block architecture magnetic memory device. In a particular embodiment, a cross-point array of resistive devices is provided. Each resistive device is paired with an isolation device. A feedback controlled control circuit is coupled to the cross-point array. The control circuit establishes an equi-potential setting within the cross-point array, and recognizes a change in current when a selected resistive device within the cross-point array is asserted to a reference state. An associated method of use is further provided.

26 Claims, 5 Drawing Sheets

1R1D MRAM BLOCK ARCHITECTURE

FIELD OF THE INVENTION

This invention relates generally to magnetic memory devices and in particular to cross-point resistive devices such as magnetic random access memory arrays (commonly referred to as "MRAM").

BACKGROUND OF THE INVENTION

Today's computer systems are becoming increasingly sophisticated, permitting users to perform an ever increasing variety of computing tasks at faster and faster rates. The size of the memory and the speed at which it can be accessed bear heavily upon the overall speed of the computer system.

Generally, the principle underlying the storage of data in magnetic media (main or mass storage) is the ability to change and/or reverse the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle, the higher it's coercivity.

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as spin valve memory cells (SVM). FIGS. 1A and 1B provide a perspective view of a typical prior art magnetic memory cell having two conductors.

As shown in prior art FIGS. 1A and 1B, a magnetic spin valve memory (SVM) cell 100 generally includes a data layer 101 (also called a storage layer or bit layer), a reference layer 103, and an intermediate layer 105 between the data layer 101 and the reference layer 103. The data layer 101, the reference layer 103, and the intermediate layer 105 can be made from one or more layers of material. Electrical current and magnetic fields may be provided to the SVM cell 100 by an electrically conductive row conductor 107 and an electrically conductive column conductor 109. It is understood and appreciated that as used herein, the terms row and column conductor have been selected for ease of discussion. Under appropriate circumstances these labels may be reversed and or otherwise substituted for such titles as word line and bit line.

The data layer 101 is usually a layer of magnetic material that stores a bit of data as an orientation of magnetization M1 that may be altered in response to the application of an external magnetic field or fields. More specifically, the orientation of magnetization M1 of the data layer 101 representing the logic state can be rotated (switched) from a first orientation, representing a logic state of "0", to a second orientation, representing a logic state of "1", and/or vice versa.

The reference layer 103 is usually a layer of magnetic material in which an orientation of magnetization M2 is "pinned", as in fixed, in a predetermined direction. The direction is predetermined and established by microelectronic processing steps employed in the fabrication of the magnetic memory cell.

Typically, the logic state (a "0" or a "1") of a magnetic memory cell depends on the relative orientations of magnetization in the data layer 101 and the reference layer 103. For example, when an electrical potential bias is applied across the data layer 101 and the reference layer 103 in an SVM cell 100, electrons migrate between the data layer 101 and the reference layer 103 through the intermediate layer 105. The intermediate layer 105 is typically a thin dielectric layer commonly referred to as a tunnel barrier layer. The phenomena that cause the migration of electrons through the barrier layer may be referred to as quantum mechanical tunneling or spin tunneling.

The logic state may be determined by measuring the resistance of the memory cell. For example, if the overall orientation of the magnetization in the data layer 101 is parallel to the pinned orientation of magnetization in the reference layer 103 the magnetic memory cell will be in a state of low resistance, R. If the overall orientation of the magnetization in the data layer 101 is anti-parallel (opposite) to the pinned orientation of magnetization in the reference layer 103, the magnetic memory cell will be in a state of high resistance $R+\Delta R$. The orientation of M1 and, therefore, the logic state of the SVM cell 100 may be read by sensing the resistance of the SVM cell 100.

The resistance may be sensed by applying a voltage to a selected SVM cell 100 and measuring a sense current that flows through the SVM cell 100. Ideally, the resistance is proportional to the sense current.

In a typical MRAM device, the SVM cells are arranged in a cross-point array. Parallel conductive columns (column 1, 2, 3 . . . ), also referred to as word lines, cross parallel conductive rows (row A, B, C . . . ), also referred to as bit lines. The traditional principles of column and row arrays dictate that any given row will only cross any given column once.

An SVM cell is placed at each intersecting cross-point between a row and a column. By selecting a particular row (B) and a particular column (3), any one memory cell positioned at their intersection (B,3) can be isolated from any other memory cell in the array. Such individual indexing is not without complexities.

A typical MRAM cross-point array may easily consist of 1,000 rows and 1,000 columns uniquely addressing 1,000,000 SVM cells. Sensing the resistance state of a given SVM cell in the cross-point array can be unreliable. The cross-point array may be characterized as a resistive cross-point device. All of the resistive elements (the SVM cells) within the array are coupled together through the parallel sets of row and column conductors. The resistance between a selected row and a selected column equals the resistance of the element at that cross point (R) in parallel with a combination of resistances of the unselected resistive elements (2R/1000+R/1000000).

Unselected resistive elements also are prone to permitting the development of sneak path current, $\Delta V*1000/R$. Where R is on the order of 1 mega-ohm and $\Delta V$ is 50 micro-volts, there will be 50 pico-amps per sneak path, or 50 nano-amps where there are 1,000 rows. Expanding the cross-point array to 10,000×10,000 the combined sneak path may total 500 nano-amps. The efficiency of a sense amplifier detecting changes in sense currents on the order of 20 to 50 nano-amps when the selected memory element is changed from R to $R+\Delta R$ is reduced in the presence of large sneak path currents. Sense amplifiers can be made to operate when the ratio of sense current to sneak path current is as bad as 1/10. If the sneak path current is increased as in the example, from 50 nano-amps to 500 nano-amps when sensing a signal current of 20 nano-amps, the reliability of the sense amplifier will be reduced.

Understanding the propensity for sneak current to occur in the memory array, the design parameters must be accommodating. The effective size of a typical resistive memory cross-point array is therefore limited to about 1,000×1,000.

Adding switches, such as transistors (T) or diodes (D), to each resistive element (R) to aid in their isolation has proven costly in the past both in terms of space within the array and the complexity of manufacturing. Generally, in such arrangements the number of resistive elements paired with the number of transistors or diodes is written as #R#T or #R#D.

In addition, the use of a diode introduces a resistance problem. The forward isolation diodes typically have a wide range of forward I_V characteristics where the V_diode may range from 0.5V to 1.5V. Leakage currents may also range from nano-amps to milli-amps and temperature may introduce yet other variables in performance and behavior.

Hence, there is a need for an ultra-high density resistive device, such as a magnetic memory device, which overcomes one or more of the drawbacks identified above. The present invention accomplishes this objective, among others.

SUMMARY

This invention provides an ultra-high density resistive device, such as a 1R1D magnetic memory device.

In particular, and by way of example only, according to an embodiment of the present invention, this invention provides a data storage device including: a cross-point array of resistive devices, each resistive device paired with an isolation device; a feedback controlled control circuit coupled to the cross-point array, the control circuit establishing an equi-potential setting within the cross-point array, and recognizing a change in current when a selected resistive device within the cross-point array is asserted to a reference state.

In yet another embodiment, the invention may provide a method of performing a read operation on a selected memory cell in a resistive cross-point array consisting of a plurality of parallel electrically conductive rows crossing a plurality of electrically conductive columns, a plurality of magnetic memory cells, each memory cell paired with an isolation diode and in electrical contact with and located at an intersection between a row and column, a sample and hold circuit coupled to the cross-point array, and a feedback controlled control circuit coupled to the cross-point array, the control circuit having a selected column amplifier, an unselected row amplifier, a control amplifier, the control circuit being switchably coupled to the sample and hold circuit; the method including: closing a switch from the control circuit to the sample and hold circuit; applying a first voltage (VA) through the sample and hold circuit to selected column amplifier and the unselected row amplifier; applying a second voltage (VA') from the selected column amplifier to the to the selected column; applying a third voltage (VA") from the unselected row amplifier to at least a subset of the unselected rows; sensing a feedback current (I_sense) from the selected column; comparing the feedback current (I_sense) to a reference current (I_ref); adjusting the first voltage (VA) to minimize the difference between the feedback current (I_sense) and the reference current (I_ref); opening the switch from the control circuit to the sample and hold circuit; determining the initial resistance state of the selected memory cell by changing the resistance state of the selected memory cell while adjusting the second voltage (VA') to minimize the difference between the first voltage (VA) and the second voltage (VA').

These and other objects, features and advantages of the preferred method and apparatus will become apparent from the following detailed description, taken in conjunction with the accompanying drawings which illustrate, by way of example the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Figure 1A:
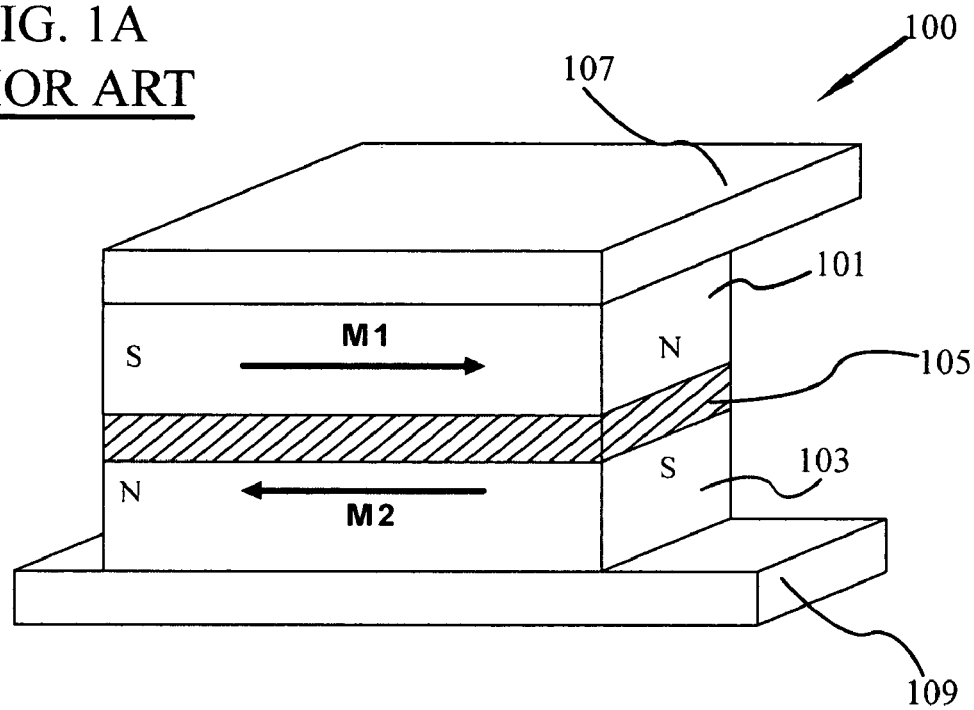
FIGS. 1A–1B provide perspective views of a prior art magnetic memory cell.
Figure 1B:
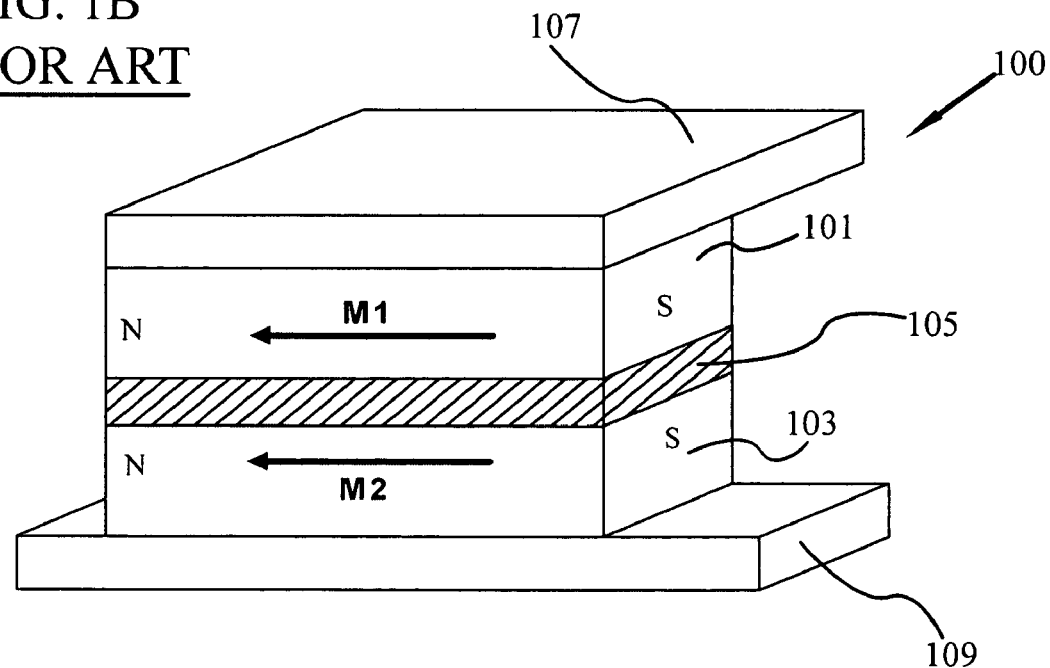
Figure 2:
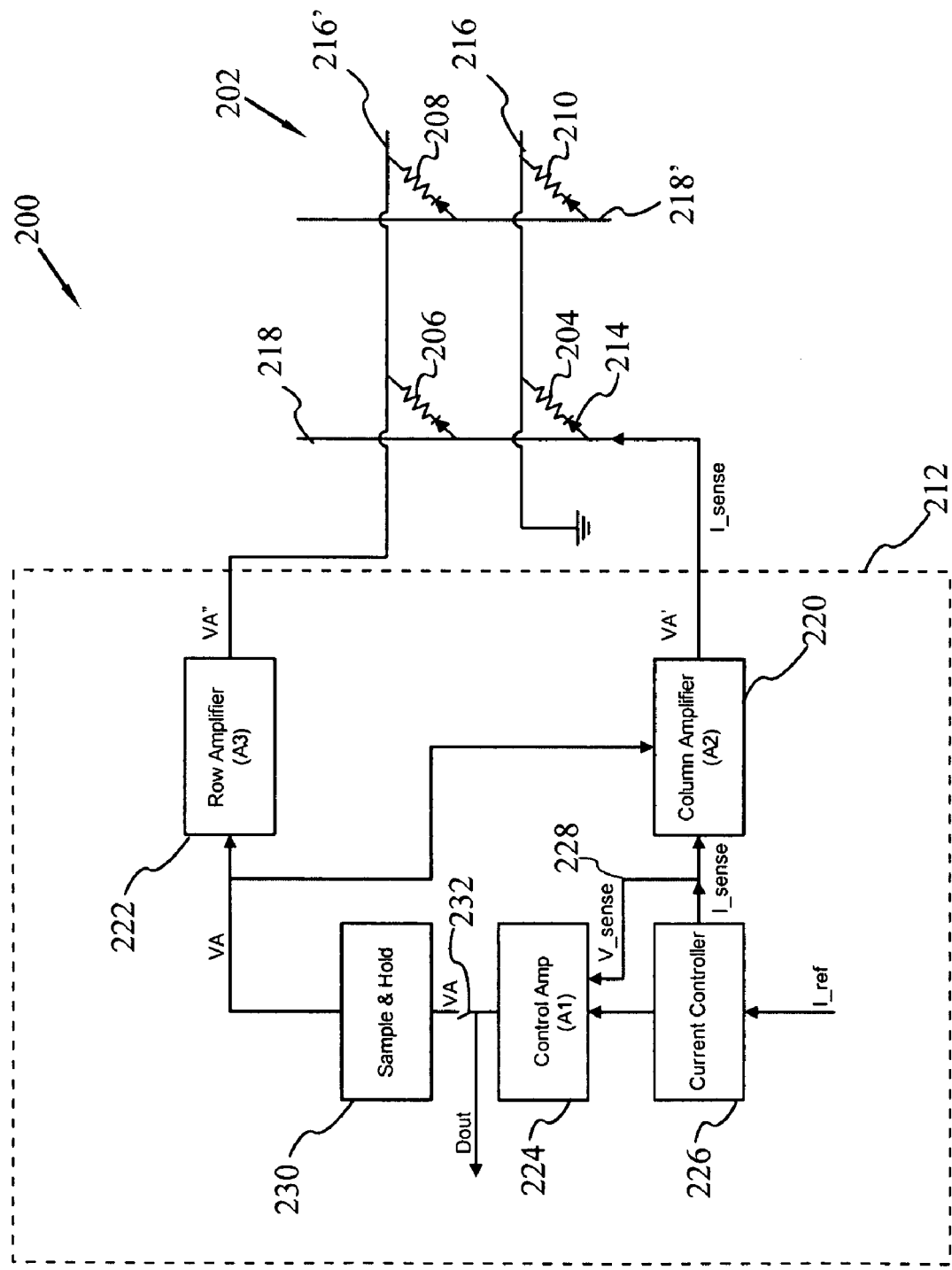
FIG. 2 is a block diagram of the 1R1D data storage device according to an embodiment of the present invention.

Referring now to the drawings, and more particularly to FIG. 2, there is shown a portion of a data storage device 200, including a cross-point array 202 of 1R1D resistive devices (204, 206, 208, 210) and a feedback controlled control circuit 212 coupled to the cross-point array 202. The resistive devices are characterized as 1R1D devices, for, as shown with respect to resistive device 204, each resistive device 204 is paired with an isolation device. In at least one embodiment the isolation device is an isolation diode 214. Data storage device 200 may therefore be referred to as having a 1R1D block architecture, or more simply a 1R1D data storage device 200.

The cross-point array 202, includes a plurality of parallel electrically conductive rows 216, 216' and a plurality of parallel electrically conductive columns 218, 218' crossing the rows, each thereby forming a plurality of intersections. Each resistive device paired with an isolation device is in electrical contact with, and located at an intersection between, a row and a column. As such, electrical current, voltage potential, and magnetic fields may be provided to a selected resistive device 204 by electrically conductive column 218 and electrically conductive row 216.

The feedback controlled control circuit 212 advantageously establishes an equi-potential setting within the cross-point array 202 and recognizes a change in current when a selected resistive device within the cross-point array 202 is asserted to a reference state. More specifically, the feedback controlled control circuit 212 includes a selected column amplifier 220, an unselected row amplifier 222, and a control amplifier 224. The selected column amplifier 220 connects to a selected electrically conductive column 218, intersecting a selected resistive device 204. The unselected row amplifier 222 connects to the unselected electrically conductive row 216'. The control amplifier 224 receives a reference current from a current controller 226 and a feedback sense current from the cross-point array 202, shown as feedback sense path 228.

To initialize the equi-potential setting of the cross-point array 202, the control amplifier 224 provides a first voltage (VA) to the selected column amplifier 220 and the unselected row amplifier 222. The control amplifier adjusts the first voltage VA to minimize the difference between the reference current (I_ref) and the sense current (I_sense).

When the first voltage VA has been set, a sample and hold circuit 230 maintains VA at the properly adjusted level for the sense operation. A switching element 232 then permits the control amplifier 224 to provide a data out signal in response to the feedback sense current of a current flow through the selected resistive device 204.

Figure 3:
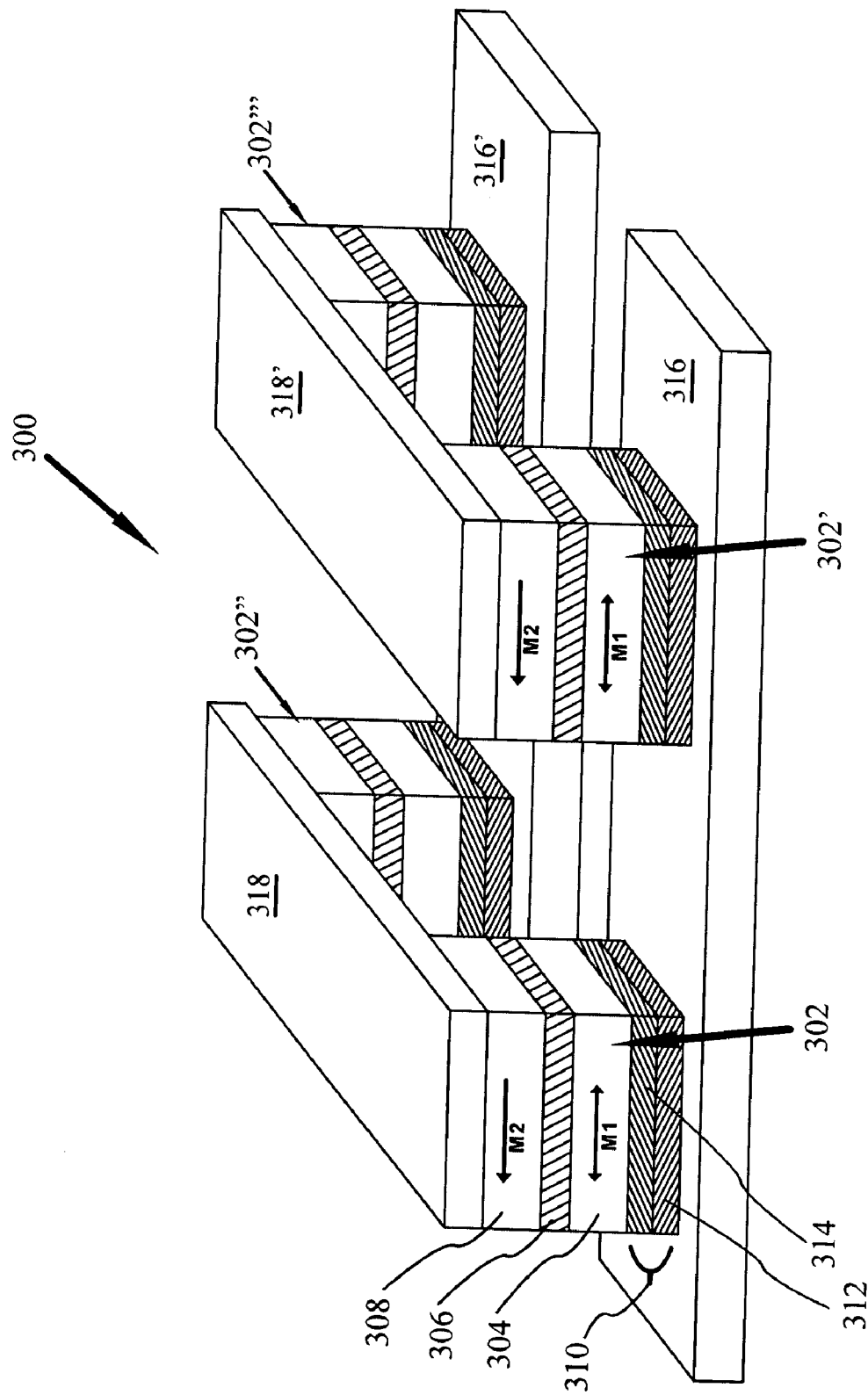
FIG. 3 is a partial perspective view of the cross-point array shown in FIG. 2.

As shown in FIG. 3, in at least one embodiment, the resistive cross-point array 300 is comprised of spin valve memory (SVM) cells 302~302'''. Each SVM cell 302 includes at least one ferromagnetic data layer 304, an intermediate layer 306, and a ferromagnetic reference layer 308. The ferromagnetic data layer 304 permits the storing of a bit of data as an alterable orientation of magnetization M1. The intermediate layer 306 has opposing sides such that the data layer 304 in contact with one side is substantially in direct alignment with, and substantially uniformly spaced from, the reference layer 308.

In at least one embodiment, the reference layer 308 is a pinned reference layer, characterized by a pinned orientation of magnetization M2. In at least one alternative embodiment, the reference layer is a soft-reference layer, characterized by a non-pinned orientation of magnetization M2 and a lower coercivity than the data layer 304.

The ferromagnetic data layer 304 and the reference layer 308 may be made from a material that includes, but it not limited to: Nickel Iron (NiFe), Nickel Iron Cobalt (NiFeCo), Cobalt Iron (CoFe), and alloys of such metals. In addition, both the reference layer 308 and the data layer 304 may be formed from multiple layers of materials. However, for conceptual simplicity and ease of discussion, each layer component is herein discussed as a single layer.

The SVM cell 302 is coupled to a thin film diode such as a PN diode 310 provided as an isolation diode. As a thin film structure, the composite layers of P-doped Silicon 312 and N-doped Silicon 314 are each set down in the manufacturing process as are the internal layers of the SVM cell 302. Through traditional processes of photolithography and or ion-beam etching, the PN diode 310 is patterned to be substantially about the same size as the base of the SVM cell 302. The use of thin film PN diodes is advantageous over a substrate diode as the thin film process may be easily incorporated into the overall fabrication process of the cross-point array and SVM cells.

As shown, a plurality of electrically conductive columns 316, 316' cross a plurality of electrically conductive rows 318, 318', thereby forming a plurality of intersections. Each SVM cell 302~302''' is in electrical contact with and located at an intersection between a row and column. As such, electrical current and magnetic fields may be provided to the SVM cell 302 within the cross-point array 300 by electrically conductive column 316 and electrically conductive row 318.

Figure 4:
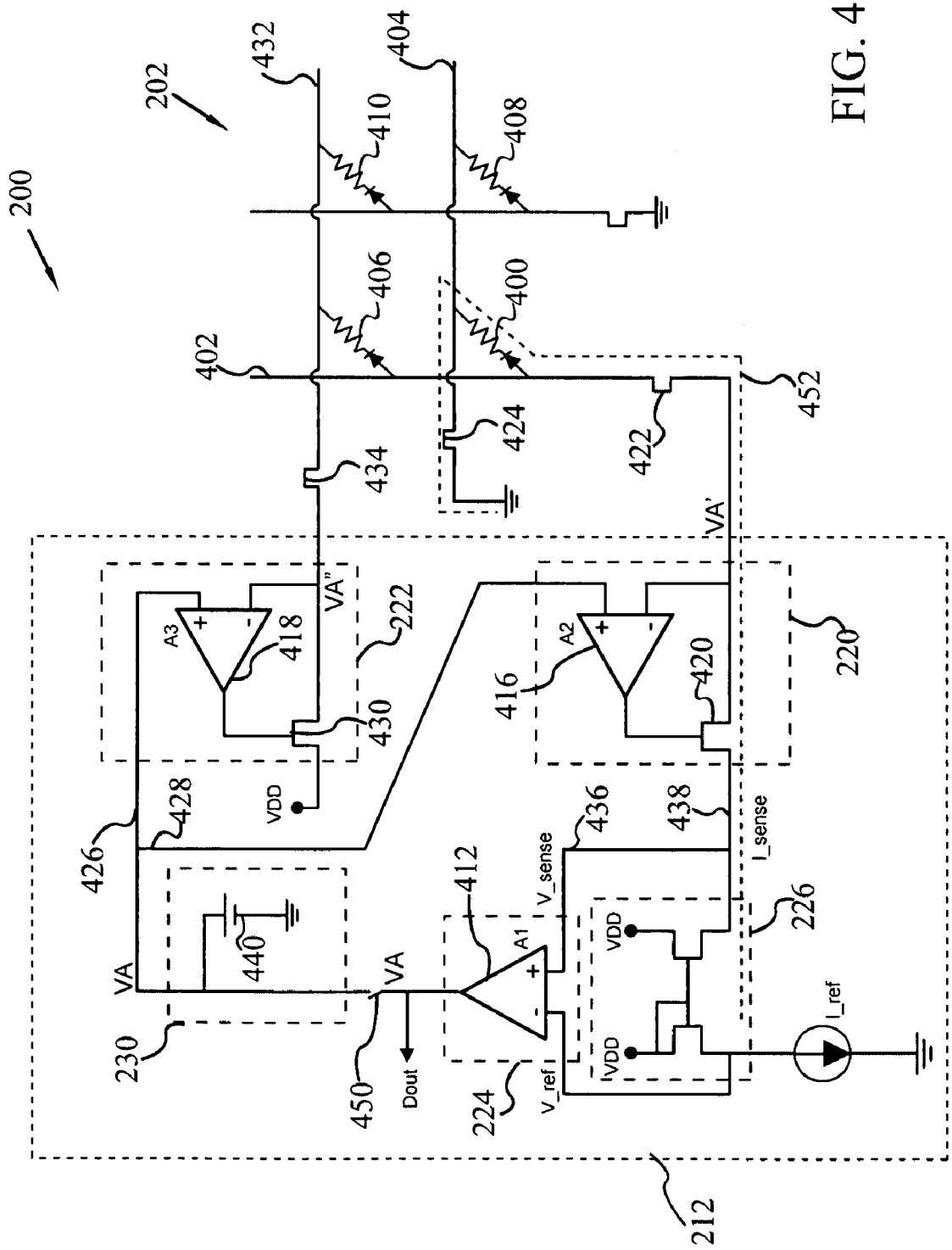
FIG. 4 is a refined illustration of the 1R1D data storage device shown in FIG. 2.

The tendency of thin film PN diodes to add series resistance when biased in the forward conduction mode and to have high leakage currents when biased in the blocking mode are advantageously reduced, if not otherwise eliminated, by the feedback controlled control circuit 212. FIG. 4 provides a conceptual electrical schematic of the 1R1D data storage device 200, cross-point array 202 and feedback controlled control circuit 212. A selected SVM cell 400 is represented by a resistor/diode pair along a selected column conductor 402 (hereinafter, "selected column") and selected row conductor 404 (hereinafter, "selected row"). Unselected SVM cells 406~410 are also represented by resistor/diode pairs.

The operation of the feedback controlled control circuit 212 can be into two phases. In the first phase, the cross-point array 202 is initialized to an equi-potential setting; in the second phase, a change in current is recognized when a selected SMV cell 400 is asserted to a reference state. This advantageous ability is achieved through the use of control amplifier (A1) 412, selected column amplifier (A2) 416, and unselected row amplifier (A3) 418. Switch element 450 closes to permit initialization and opens to permit sensing.

In initializing the cross-point array 202 to commence with the sensing of selected SVM cell 400, switch element 450 is closed. The current controller 226, such as a current mirror, is provided with reference current I_ref, and provides current dependent reference voltage V_ref to the "−" terminal of the control amplifier (A1) 412 and a sense current I_sense to a pass transistor 420 governed by selected column amplifier (A2) 416, which in turn connects through select element 422 to the selected column 402. Select element 424 provides a substantially ground connection to the selected row 404, thus permitting the power path through selected SVM cell 400 as represented by dotted line 452.

A sense feedback current, V_sense is provided to the "+" terminal of the control amplifier 412. V_sense is a measure of the relative value of I_sense and I_ref and is used to control the output of VA by the control amplifier 412. When I_sense<I_ref, V_sense will go high and when I_sense>I_ref, V_sense will go low. The control amplifier 412 adjusts the output voltage VA to minimize the difference between the reference current (V_ref) and the feedback sense current (V_sense). In at least one embodiment, the feedback sense current and is obtained from the selected column 402.

The output voltage VA is provided by power path 426 and 428 to the positive terminals of selected column amplifier 416 and unselected row amplifier 418. The selected column amplifier 416 provides a second voltage VA' to the selected column 402. Unselected row amplifier 418 provides a third voltage VA" to at least a subset of unselected row conductors.

Selected column amplifier 416 and unselected row amplifier 418 are each voltage follower amplifiers. Simply stated, each is an amplifier with a unity gain functioning to provide current amplification. A unity gain amplifier is characterized by a high input impedance (high input resistance) and a low output impedance. As such, when an input voltage is applied, such as VA, a very small input current (approaching about zero) may flow while the output voltage VA' (for the selected column amplifier 416) and VA" (for the unselected row amplifier 418) is maintained at or near VA. In addition, each amplifier supplies a substantial current to the output load circuits. As a result, these amplifiers (416, 418) may be used to maintain a constant voltage on a load resistor when the load resistor varies over a range of values, such as is the behavior of thin film PN diodes.

In other words, when the voltage VA on the "+" side of selected column amplifier 416 starts to go low, the voltage will track the input voltage and selected column amplifier 416 will tend to turn off the pass transistor 420, increasing resistance. This will force the voltage VA' to drop, as in to go lower, as well. When the voltage VA on the "+" side starts to go high, the voltage will again track the input voltage and the selected column amplifier 416 will tend to turn on the pass transistor 420, lowering resistance. This will permit the voltage VA' to go high.

In a substantially similar fashion to the selected column amplifier 416, the unselected row amplifier 418 governs pass transistor 430. As a result, the operation of the selected column amplifier 416 and unselected row amplifier 418, taken together, effectively establish an equi-potential sense amplifier. More specifically, the second voltage, VA', is substantially equi-potential to the third voltage, VA". As VA' is applied to the selected column 402 and VA" is applied to at least a subset of unselected rows 432 (illustrated only as one), by switch element 434, an equi-potential setting is established, thereby substantially eliminating sneak path currents through unselected SVM cells.

The sample and hold circuit 230 receives the first voltage VA from the control amplifier 412 as the first voltage VA is adjusted to provide the initializing equi-potential setting. Upon achieving the initial equi-potential setting, the sample and hold circuit 230 maintains the first voltage VA supplied to the selected column amplifier 416 and unselected row amplifier 418 for at least the duration of the sensing operation.

For the sense operation, switch element 450 opens to provide the output of the control amplifier 412 as a data-out signal. In an equi-potential setting, the voltage VA' is held constant through the sense operation. During the sense period the resistance of the selected SVM cell may be altered by causing the magnetic fields of the SVM cell's reference layer and data layer to vary between orientations of parallel (resistance R) and anti-parallel (resistance R+ΔR). The change in resistance from R to R+ΔR while applying a constant voltage VA' will cause the current flowing through the selected SVM cell to change from $I_{\_SVM}$ to $I\_SVM-\Delta I\_SVM$ and the sense current I_sense to change from I_sense to I_sense-I_SVM. This is in large part due to the fact that to determine the state of the SVM cell 400, an initial measured resistance of the SVM cell 400 is made and compared with the measured resistance of the SVM cell 400 when the orientation is asserted to a known reference state. The reference state may be a known parallel and/or anti-parallel state.

During the sense operation, the feedback of V_sense as compared to V_ref permits the sensing of the current flow through the selected SVM cell 400 to be converted to a data out signal by the control amplifier 412. It is understood and appreciated that the second voltage VA' is substantially automatically adjusted by the selected column amplifier 416 as the resistance state of the selected SVM cell 400 is changed. Moreover VA' maintained at substantially the same potential during the sensing operation.

By incorporating PN diodes such as PN diode 310, the effective size of the cross-point array 202 may be increased beyond the traditional 1,000 columns by 1,000 rows. The equi-potential setting imposed upon the cross-point array 202 advantageously alleviates the varying voltage issues that isolation devices such as PN diodes may harbor. With the equi-potential setting achieved, the sensing of current flow through the selected SVM cell 400 permits the state of resistance to be inferred, and as a result, the data state of the selected SVM cell 400.

Having described the above physical embodiment of the 1R1D data storage device 200, another embodiment relating to the method of use for the 1R1D data storage device 200 will now be described with reference to the flowchart of FIG. 5. It will be appreciated that the described method need not be performed in the order in which it is herein described, but that this description is merely exemplary of at least one method of using the 1R1D data storage device 200, in accordance with the present invention.

Figure 5A:
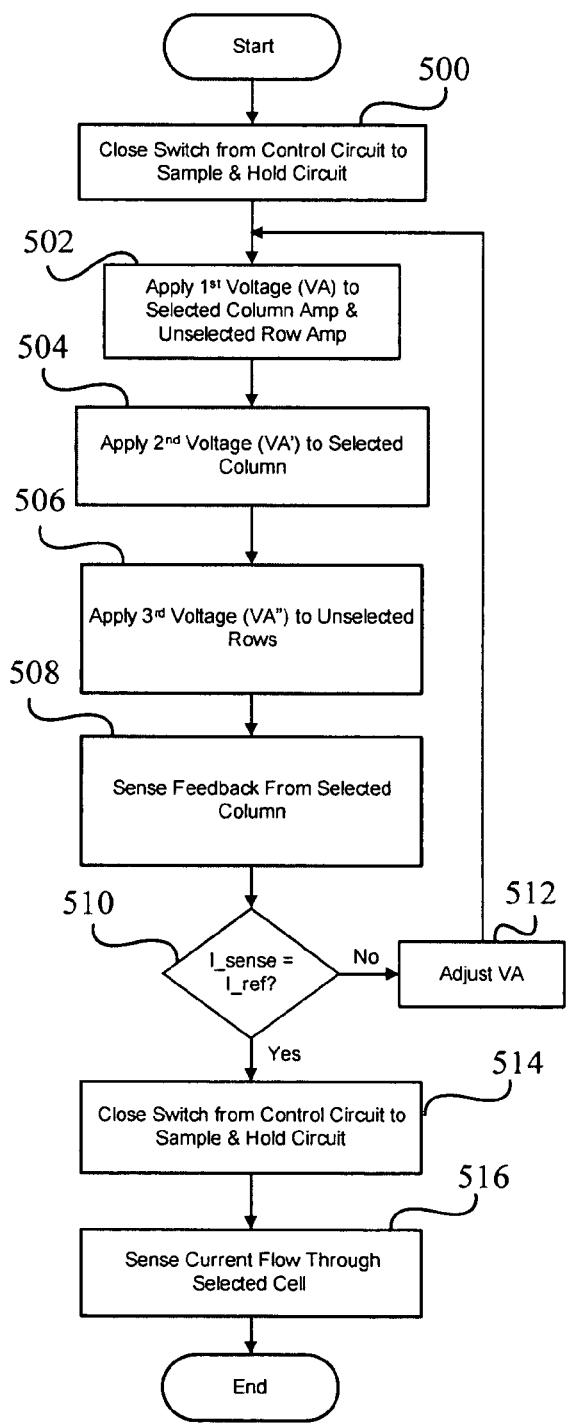
FIGS. 5A and 5B are flowcharts depicting the steps of sensing the cross-point array shown in FIGS. 2–4.

Referring to the components illustrated in FIG. 4, and as indicated in the flowchart of FIG. 5A, the sense operation commences with the closing of switch element 450 from the control amplifier 412 to the sample and hold circuit 230, block 500. A first voltage VA, is applied through the sample and hold circuit 230 to the selected column amplifier 416 and unselected row amplifier 418 by power paths 426 and 428, block 502.

To establish the equi-potential setting within cross-point array 202, selected column amplifier 416 provides a second voltage VA' to the selected column 402, block 504. Selection of the selected column is facilitated by select element 422. In a substantially contemporaneous operation, unselected row amplifier 418 provides a third voltage VA" to at least a subset of unselected rows 432, block 506. Selection of the unselected rows is facilitated by switching element 434.

To achieve the equi-potential relationship between VA' and VA", the control amplifier 412 senses feedback via feedback path 436, block 508. Feedback path 436 is coupled to power path 438, providing current I_sense to the selected column 402, as governed by selected column amplifier 416. The control amplifier 412 is also provided with V_ref by the current controller 226.

The control amplifier 412 compares I_ref to the feedback sense of I_sense, block 510. To minimize difference between I_ref and the feedback sense, the control amplifier 412 adjusts VA as it is provided by power paths 426 and 428 to selected column amplifier 416 and unselected row amplifier 418, block 512. As VA is adjusted, VA' and VA" are also adjusted.

The I_ref may be pre-determined; however, under appropriate circumstances, a calibration cycle may be performed during the sense operation to adjust I_ref–I_sense to be substantially zero. Following the calibration operation, the sense operation continues as herein described.

As VA is applied through the sample and hold circuit 230, when the proper level of VA is achieved, capacitor 440 is affectively charged with the adjusted VA. With VA established in the sample and hold circuit 230, switch element 450 from the control amplifier 412 to the sample and hold circuit 230 is opened, block 514. Having established the equi-potential setting within cross-point array 202, the initial current flowing through the selected SVM cell 400 is then sensed and the data state of SVM cell 400 inferred, block 516.

More specifically, as described above and with respect to FIG. 3, the SVM cells permit the storing of a bit of data as an alterable orientation of magnetization, M1. When the orientation of the reference layer 308 is parallel to the orientation of the data layer 304, the resistance within the SVM cell will be a low resistance, data '0'. When the orientation of the reference layer 308 is anti-parallel to the orientation of the data layer 304, the resistance within the SVM cell will be a high resistance, data '1'.

Figure 5B:
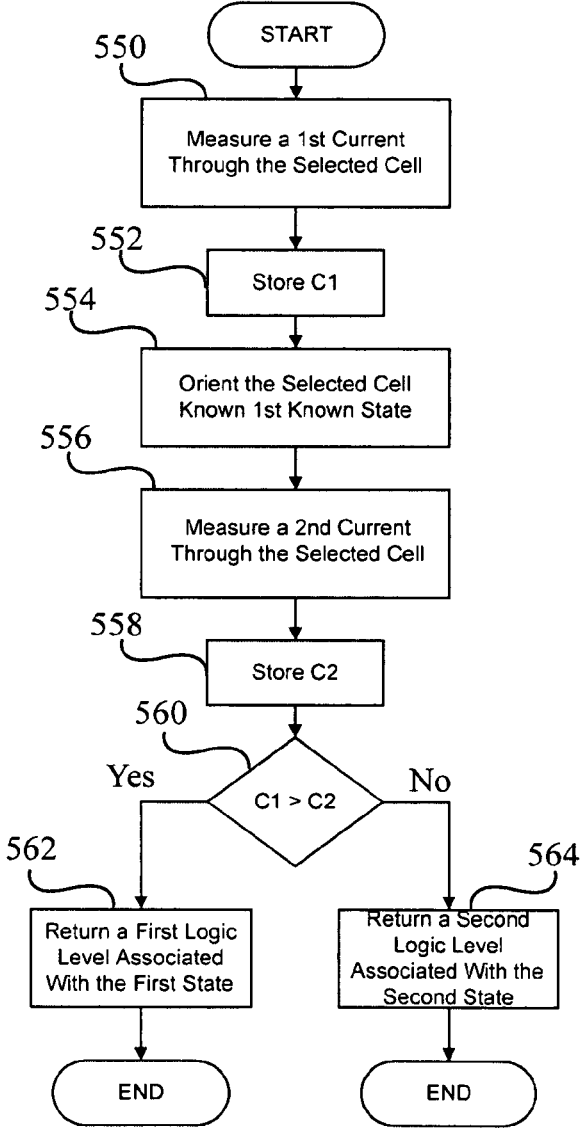

The flowchart of FIG. 5B illustrates at least one method of determining the data value within the selected cell. In at least one embodiment, with the cross-point array 202 in an equi-potential state, the sensing of the current through the selected SVM cell is accomplished in the following manner. A measurement of a $1^{st}$ current (C1) flowing through the selected cell made and recorded as shown in blocks 550 and 552. The control amplifier 412 senses a feedback from the current flow by feedback path 436. In at least one embodiment, this measurement of current flow is made according to an integration time.

The orientation of the selected SVM cell 400 is then set to a known orientation, block 554. Referring to FIG. 3, this may be achieved by writing the data layer 304 to a known direction. In at least one alternative embodiment involving a soft-reference layer in place of a pinned reference layer, the orientation of the soft-reference layer 308 may be aligned to a known direction. The alignment of the data layer 304, or soft-reference layer 308 is accomplished by applying a sufficient magnetic field to the SVM cell 302.

With the magnetic field of the SVM cell 400 oriented in a known direction the measurement of a second current (C2) is made and recorded while VA' is adjusted by the selected column amplifier 416, blocks 556 and 558. The adjustment of VA' to remain substantially equal to VA, serves to ensure the equi-potential balance between VA' and VA".

With the value of C2 now known, C1 and C2 may be compared, such as C1>C2. shown in decision 560. As C2 is a known orientation, the state of the SVM cell 400 may be inferred by the result of the comparison. If the initial current is greater than the second current (C1>C2), a first logic level associated with the first state is returned, block 562. Where the initial current is not greater than the second current a second logic level associated with the second state is returned, block 564.

In at lest one embodiment, a triple sample sense may be performed. For a triple sense, the orientation of the cell is set first to a known orientation, as indicated above. A measurement of the current C2 is taken and recorded. The orientation of the cell is then set to a second known orientation, opposite of the first. A measurement of the current C3 is then taken and recorded. C2 and C3 may then be taken and averaged for comparison with C1—the initial value sensed in an unknown state. Where the data layer 304 is re-oriented, it is understood and appreciated that, if necessary, a write-back will be performed to restore the initial orientation of M1.

It is understood and appreciated that a convention will be adopted such as, for example, a logic state of "1" exists where M1 and M2 are anti-parallel (high resistance) in a first state, and a logic state of "0" exists where M1 and M2 are parallel (low resistance) in a second state. It is important to note that the sensing of the initial resistance (the first resistance) may be performed repeatedly, and averaged. So too may the sensing of the second resistance be performed repeatedly, as it is well known and appreciated that with greater sampling there is a reduction in arbitrary error.

The sense method may be further summarized as follows. The sense operation is initialized by establishing an equi-potential state VA at I_sense (the first sense current). The state of this first sense current is stored in the sample and hold circuit 230 by opening switch 450. The resistance state of the selected SMV cell is changed to a known state, causing a second sense current to flow. The second sense current is compared to I_ref.

If the second sense current is approximately the same as the first sense current, the output of the control amplifier A1 will remain unchanged. If the second sense current is less than the first sense current, the output of A1 will be driven to a high state. If the second sense current is greater than the first sense current the output of A1 will be driven to a low state.

By comparing the output to a known state, the initial state of eth SVM cell may be determined. If the initial state is different from the reference (known) state for the second sense, the initial state may have to be written back to restore the SVM cell to the initial state. It is understood and appreciated that other forms of data sensing may be employed, such as, for example, integrating the sense current after the initial setup of VA' and VA".

It is to be appreciated that the value of VA to establish the equi-potential setting within cross-point array 202 is advantageously a self determined act and does not require a preset value. As such, the feedback controlled control circuit 212 is advantageously capable of correctly responding to a wide range of factors including, but not limited to, isolation diodes with a wide range of forward current and voltage characteristics, i.e., a range from about 0.5 V to 1.5V. A wide range of leakage current from nano-amps to milli-amps is also accommodated, as is a temperature range from 0~100 degrees centigrade.

Moreover, the 1R1D data storage device 200 advantageously combines equi-potential isolation with diode isolation to permit the sensing of variable resistive elements, such as SVM cells, in very large arrays. The equi-potential isolation overcomes the deficiencies of high leakage currents found in non-ideal series isolation diodes.

Another embodiment may be appreciated to be a computer system incorporating the 1R1D data storage device 200 as described above. A computer with a main board, CPU and at least one memory store comprised of an embodiment of the 1R1D data storage device 200 having a cross-point array 202 of SMV cells paired to isolation diodes and a feedback controlled control circuit 212, establishing an equi-potential setting within the cross-point array 202, and recognizing a change in current when a selected SVM cell within the cross-point array 202 is asserted to a reference state, raises the advantages of the data storage device 200 to a system level.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A data storage device comprising:
    a cross-point array of resistive devices, each resistive device paired with an isolation device;
    a sample and hold circuit coupled to the cross-point array; and
    a feedback controlled control circuit coupled to the cross-point array and switchably connecting to the sample and hold circuit, the control circuit determining from the cross-point array a voltage to establish an equi-potential setting within the cross-point array, and recognizing a change in current when a selected resistive device within the cross-point array is asserted to a reference state.

2. The data storage device of claim 1, wherein the isolation device is an isolation diode.

3. The data storage device of claim 1, wherein the resistive devices are SVM cells, each cell including:
    at least one ferromagnetic data layer characterized by an alterable orientation of magnetization;

an intermediate layer in contact with the data layer; and
at least one ferromagnetic reference layer in contact with the intermediate layer, opposite from the data layer.

4. The data storage device of claim 1, wherein the cross-point array further includes:
a plurality of parallel electrically conductive rows; and
a plurality of parallel electrically conductive columns crossing the rows, each thereby forming a plurality of intersections;
wherein each resistive device paired with an isolation device is in electrical contact with and located at an intersection between a row and column.

5. The data storage device of claim 4, wherein the feedback control circuit further includes:
a selected column amplifier connecting to a selected column conductor intersecting a selected cell;
an unselected row amplifier connecting to unselected row conductors; and
a control amplifier, receiving a reference current from a current source and a feedback sense current from the cross-point array;
wherein the control circuit initializes the cross-point array to an equi-potential setting by determining from the array a first voltage (VA) to provide to the selected column amplifier and the unselected row amplifier from the control amplifier, the control amplifier adjusting the first voltage (VA) to minimize the difference between the reference current and the feedback sense current.

6. The data storage device of claim 5, wherein the selected column amplifier and unselected row amplifier are voltage follower amplifiers.

7. The data storage device of claim 5, wherein the operation of the selected column amplifier and the unselected row amplifier taken together effectively establish an equi-potential sense amplifier.

8. The data storage device of claim 5, wherein the feedback sense is obtained from the selected column conductor.

9. The data storage device of claim 5, wherein the sample and hold circuit receives the first voltage (VA) from the control amplifier as the first voltage is adjusted to provide the initializing equi-potential setting and holds the first voltage at the adjusted level during a sensing operation.

10. The data storage device of claim 9, wherein during the sense operation the feedback sense current of current flowing through the selected resistive device is converted to a data-out signal by the control amplifier.

11. The data storage device of claim 5, wherein the selected column amplifier provides a second voltage (VA') to the selected column conductor, and the unselected row amplifier provides a third voltage (VA") to at least a subset of unselected row conductors to establish an equi-potential setting within the cross-point array.

12. The data storage device of claim 11, wherein the second voltage (VA') is substantially equi-potential to the third voltage (VA").

13. The data storage device of claim 11, wherein the second voltage (VA') is adjusted as the resistance state of the selected resistive device is changed.

14. A data storage cross-point array comprising:
a plurality of parallel electrically conductive rows; and
a plurality of parallel electrically conductive columns crossing the rows, each thereby forming plurality of intersections;
a plurality of SVM cells, each SVM cell paired with an isolation diode and in electrical contact with and located at an intersection between a row and a column;
a sample and hold circuit coupled to the cross-point array, and
a feedback controlled control circuit coupled to the cross-point array and switchably connecting to the sample and hold circuit, the control circuit including:
a selected column amplifier connecting to a selected column conductor intersecting a selected cell, the selected column amplifier coupled to the sample and hold circuit;
an unselected row amplifier connecting to unselected row conductors, the unselected row amplifier coupled to the sample and hold circuit; and
a control amplifier, receiving a reference current from a current source and a feedback sense current from the selected column conductor of the cross-point array;
wherein the control circuit initializes the cross-point array to an equi-potential setting by determining from the cross-point array a first voltage (VA) to establish the equi-potential setting and connecting the control amplifier to the sample and hold circuit to establish the first voltage (VA) provided to the selected column amplifier and the unselected row amplifier, the control amplifier adjusting the first voltage (VA) to minimize the difference between the reference current and the feedback sense current.

15. The data storage device of claim 14, wherein the selected column amplifier and unselected row amplifier are voltage follower amplifiers.

16. The data storage device of claim 14, wherein the operation of the selected column amplifier and the unselected row amplifier taken together effectively establish an equi-potential sense amplifier.

17. The data storage device of claim 14, wherein the sample and hold circuit holds the first voltage (VA) substantially constant during a sensing operation.

18. The data storage device of claim 14, wherein during the sense operation the feedback sense current of current flowing through the selected SVM cell is converted to a data-out signal by the control amplifier.

19. The data storage device of claim 14, wherein the selected column amplifier provides a second voltage (VA') to the selected column conductor, and the unselected row amplifier provides a third voltage (VA") to at least a subset of unselected row conductors to establish an equi-potential setting within the cross-point array.

20. The data storage device of claim 19, wherein the second voltage (VA') is substantially equi-potential to the third voltage (VA").

21. The data storage device of claim 19, wherein the second voltage (VA') is adjusted as the resistance state of a selected resistive device is changed.

22. A method of performing a read operation on a selected SVM cell in a resistive cross-point array consisting of a plurality of parallel electrically conductive rows crossing a plurality of electrically conductive columns, a plurality of SVM cells, each SVM cell paired with an isolation diode and in electrical contact with and located at an intersection between a row and column, a sample and hold circuit coupled to the cross-point array, and a feedback controlled control circuit coupled to the cross-point array, the control circuit having a selected column amplifier, an unselected row amplifier, a control amplifier, the control circuit being switchably coupled to the sample and hold circuit; the method comprising:

closing a switch from the control circuit to the sample and hold circuit;

applying a first voltage (VA) through the sample and hold circuit to selected column amplifier and the unselected row amplifier;

applying a second voltage (VA') from the selected column amplifier to the selected column conductor;

applying a third voltage (VA") from the unselected row amplifier to at least a subset of the unselected rows;

sensing a feedback current (I_sense) from the selected column conductor;

comparing the feedback current (I_sense) to a reference current (I_ref);

adjusting the first voltage (VA) to minimize the difference between the feedback current (I_sense) and the reference current (I_ref);

opening the switch from the control circuit to the sample and hold circuit;

determining the initial resistance state of the selected SVM cell by changing the resistance state of the selected SVM cell while adjusting the second voltage (VA') to minimize the difference between the first voltage (VA) and the second voltage (VA').

23. The method of claim 22, wherein the resistance state is determined by:

measuring a first current through the selected SVM cell when the second voltage (VA') is applied;

writing the selected SVM cell to a known magnetic orientation;

and measuring a second current through the selected SVM cell when the second voltage is adjusted to minimize the difference between the first voltage (VA) and the second voltage (VA').

24. The method of claim 22, wherein the second voltage (VA') is substantially equi-potential to the third voltage (VA").

25. The method of claim 22, wherein the first voltage VA is self-determined by the control circuit.

26. A computer system comprising:

a main board;

at least one central processing unit (CPU) coupled to the main board; and at least one memory store joined to the CPU by the main board, the memory store including;

a plurality of parallel electrically conductive rows; and a plurality of parallel electrically conductive columns crossing the rows, each thereby forming plurality of intersections;

a plurality of SVM cells, each SVM cell paired with an isolation diode and in electrical contact with and located at an intersection between a row and a column;

a sample and hold circuit coupled to the cross-point array, and a feedback controlled control circuit coupled to the cross-point array and switchably connecting to the sample and hold circuit, the control circuit including:

a selected column amplifier connecting to a selected column conductor intersecting a selected cell, the selected column amplifier coupled to the sample and hold circuit;

an unselected row amplifier connecting to connecting to unselected row conductors, the unselected row amplifier coupled to the sample and hold circuit; and a control amplifier, receiving a reference current from a current source and a feedback sense current from the selected column conductor of the cross-point array;

wherein the control circuit initializes the cross-point array to an equi-potential setting by connecting the control amplifier to the sample and hold circuit to establish a first voltage (VA) provided to the selected column amplifier and the unselected row amplifier, the control amplifier adjusting the first voltage (VA) to minimize the difference between the reference current and the feedback sense current.

* * * * *